United States Patent
Tanaka et al.

(10) Patent No.: US 8,372,792 B2
(45) Date of Patent: Feb. 12, 2013

(54) CLEANER COMPOSITION FOR REMOVING LEAD-FREE SOLDERING FLUX, AND METHOD FOR REMOVING LEAD-FREE SOLDERING FLUX

(75) Inventors: Takashi Tanaka, Osaka (JP); Kazutaka Zenfuku, Osaka (JP)

(73) Assignee: Arakawa Chemical Industries, Ltd., Osaka-shi (JP)

( * ) Notice: Subject to any disclaimer, the term of this patent is extended or adjusted under 35 U.S.C. 154(b) by 284 days.

(21) Appl. No.: 12/668,798

(22) PCT Filed: Aug. 8, 2008

(86) PCT No.: PCT/JP2008/064275
§ 371 (c)(1),
(2), (4) Date: Jan. 12, 2010

(87) PCT Pub. No.: WO2009/020199
PCT Pub. Date: Feb. 12, 2009

(65) Prior Publication Data
US 2010/0180917 A1    Jul. 22, 2010

(30) Foreign Application Priority Data

Aug. 8, 2007  (JP) .................................. 2007-207107
Jan. 30, 2008  (JP) .................................. 2008-18852

(51) Int. Cl.
*C11D 7/50* (2006.01)
(52) U.S. Cl. ........................................ 510/175; 510/176
(58) Field of Classification Search .................. 510/175, 510/176
See application file for complete search history.

(56) References Cited

U.S. PATENT DOCUMENTS

| | | | |
|---|---|---|---|
| 5,256,209 A | 10/1993 | Chihara | |
| 7,250,391 B2* | 7/2007 | Kanno et al. | 510/175 |
| 7,291,517 B2* | 11/2007 | Sakurai et al. | 438/106 |
| 7,410,939 B2* | 8/2008 | Noerenberg et al. | 510/435 |
| 7,543,592 B2* | 6/2009 | Lee | 134/1.3 |
| 7,579,308 B2* | 8/2009 | Lee | 510/175 |
| 8,013,035 B2* | 9/2011 | Saito et al. | 523/160 |
| 2005/0037286 A1* | 2/2005 | Hirabayashi et al. | 430/281.1 |
| 2005/0263743 A1* | 12/2005 | Lee | 252/364 |

(Continued)

FOREIGN PATENT DOCUMENTS

| | | |
|---|---|---|
| JP | 2-290982 | 11/1990 |
| JP | 4-57899 | 2/1992 |

(Continued)

OTHER PUBLICATIONS

International Search Report for International Application No. PCT/JP2008/064275 dated Oct. 29, 2008.

*Primary Examiner* — Gregory Webb
(74) *Attorney, Agent, or Firm* — Kratz, Quintos & Hanson, LLP (57) ABSTRACT

The object of the present invention is to provide a novel cleaner composition that not only reduces ignition by flame and has a small influence on the environment, but that also has an excellent property of dissolving flux residues adhered on narrow portions or in narrow gaps in an object to be cleaned that was subjected to soldering with a lead-free solder, and reduces recontamination of the object in the water-rinsing process. The present invention uses a halogen-free organic solvent (A) represented by a specific Formula; an amine-based compound (B) represented by a specific Formula; a chelating agent having no amino group (C); and, as required, water.

17 Claims, 1 Drawing Sheet

U.S. PATENT DOCUMENTS

| | | | |
|---|---|---|---|
| 2006/0089281 A1* | 4/2006 | Gibson | 510/201 |
| 2006/0094613 A1* | 5/2006 | Lee | 510/175 |
| 2006/0110907 A1* | 5/2006 | Sakurai et al. | 438/612 |
| 2006/0115970 A1* | 6/2006 | Lee | 438/584 |
| 2006/0210812 A1* | 9/2006 | Shiota | 428/447 |
| 2008/0139436 A1* | 6/2008 | Reid | 510/176 |
| 2008/0242574 A1* | 10/2008 | Rath et al. | 510/176 |
| 2009/0042762 A1* | 2/2009 | Zenfuku | 510/175 |
| 2009/0130849 A1* | 5/2009 | Lee | 438/693 |
| 2009/0131295 A1* | 5/2009 | Cui | 510/176 |
| 2009/0133716 A1* | 5/2009 | Lee | 134/3 |
| 2009/0137191 A1* | 5/2009 | Lee | 451/36 |
| 2010/0043823 A1* | 2/2010 | Lee | 134/1.3 |
| 2010/0105595 A1* | 4/2010 | Lee | 510/176 |
| 2010/0152086 A1* | 6/2010 | Wu et al. | 510/175 |
| 2010/0180917 A1* | 7/2010 | Tanaka et al. | 134/29 |
| 2011/0094545 A1* | 4/2011 | Tanaka et al. | 134/104.4 |

FOREIGN PATENT DOCUMENTS

| | | |
|---|---|---|
| JP | 4-57900 | 2/1992 |
| JP | 5-15858 | 1/1993 |
| JP | 5-21936 | 1/1993 |
| JP | 7-236862 | 9/1995 |
| JP | 8-73893 | 3/1996 |
| JP | 10-168488 | 6/1998 |
| WO | WO 2007/119392 A1 | 10/2007 |

* cited by examiner

CLEANER COMPOSITION FOR REMOVING LEAD-FREE SOLDERING FLUX, AND METHOD FOR REMOVING LEAD-FREE SOLDERING FLUX

TECHNICAL FIELD

The present invention relates to a composition for removing lead-free soldering flux, and a method for removing lead-free soldering flux.

BACKGROUND ART

Soldering is a general technique for mounting electronic components on the surface of a printed circuit board. However, soldering produces corrosive flux residues that decrease the quality of the printed circuit substrate.

For this reason, soldering must be followed by a process for cleaning the substrate, so as to remove the residues.

Among various kinds of cleaners for removing flux residues, a cleaner obtained by adding a polyoxyalkylene phosphate-based surfactant to a halogen-free organic solvent formed of a polyoxyalkylene glycol ether-based compound is known by its reduced risk of ignition by flame, small influence on environment, and excellent property of dissolving flux residues (e.g., Patent Document 1 or 2).

However, the cleaning effect of this cleaner is not sufficient when the object to be cleaned is, for example, a mounted substrate having a complicated and precise structure. For example, when cleaning a FC or BGA printed circuit board in which the chip is bonded with the circuit using a large number of micro solder bumps, flux residues adhered on micrometer-level portions or in micrometer-level narrow gaps cannot be adequately removed by the above cleaner.

In view of this problem, for example, a related art document (Patent Document 3) discloses, a cleaner containing a polyoxyalkylene alkyl ether-based halogen-free organic solvent and an amine-based compound having a specific molecular weight. This cleaner is adjusted to have a specific viscosity range at 25° C.

However, when cleaning the substrate obtained by mounting the components onto the surface thereof using a lead-free solder, the above cleaner cannot adequately remove the flux residues adhered on narrow portions or in narrow gaps. In addition, the dirt removed in the cleaning process recontaminates the object to be cleaned during the water-rinsing process, leaving white residues on the board.

When the object to be cleaned is a sheet-type article, such as a mounted board, it is common to use a spray to apply the cleaner and the rinsing liquid (water, in general) to the object so as to improve efficiency during the cleaning process and water-rinsing process.

However, for example, when water is sprayed to the object after the object is cleaned using the cleaner of Patent Document 1 or 2, a large amount of foams are generated on the surface of the object. This causes some complications in the management of the water-rinsing process. An antifoaming agent may solve this problem; however, the use of an antifoaming agent may result in improper washing.
[Citation List]
[Patent Document 1] Japanese Unexamined Patent Publication No. 1992-57899
[Patent Document 2] Japanese Unexamined Patent Publication No. 1996-73893
[Patent Document 3] Japanese Unexamined Patent Publication No. 1998-168488

SUMMARY OF INVENTION

Technical Problem

An object of the present invention is to provide a novel cleaner composition that not only reduces risk of ignition by flame and has a small influence on the environment (hereinafter, this advantage is referred to as "safety and the like"), but that also has an excellent property of dissolving flux residues adhered on narrow portions or in narrow gaps in an object to be cleaned that was subjected to soldering with a lead-free solder (this property may be referred to hereinafter as the "gap-cleaning property"), and reduces recontamination of the object in the water-rinsing process (this property may be referred to hereinafter as the "contamination prevention property").

Another object of the present invention is to provide a novel cleaner composition that is not only superior in safety and the like, gap-cleaning property, and contamination prevention property, but also produces less foams in the spray-form water-rinsing process (this property may be referred to hereinafter as the "low-foaming property").

Technical Solution

The inventors of the present invention assumed that the aforementioned problems were caused by a large amount of tin, tin ion, their compounds or the like in the flux residues derived from the lead-free solder. As a result of intensive study based on this assumption, the inventors of the present invention found that a cleaner having the following specific composition can solve this problem. Specifically, the present invention relates to the following cleaner compositions for removing lead-free soldering flux, and methods for removing lead-free soldering flux.

Item 1. A cleaner composition for removing lead-free soldering flux, comprising a halogen-free organic solvent (A) formed of a compound represented by Formula (1-1) and/or a compound represented by Formula (1-2); an amine-based compound (B) represented by Formula (2); a chelating agent having no amino group (C); and, as required, water.

[Chem. 1]

wherein $R^1$ represents $C_{1-6}$ alkyl group, $R^2$ represents methyl group or hydrogen atom, $X^1$ represents $C_{1-5}$ alkyl group or hydrogen atom, and "a" represents an integer ranging from 2 to 4.

[Chem. 2]

wherein $R^3$ represents $C_{1-6}$ alkyl group, $R^4$ represents methyl group or hydrogen atom, $X^2$ represents $C_{1-5}$ alkyl group or hydrogen atom, and "b" represents an integer ranging from 2 to 4.

[Chem. 3]

(2)

wherein $R^5$ represents $C_{1-7}$ alkyl group, Y represents $C_{1-5}$ alkyl group or hydrogen atom, "c" is an integer ranging from 1 to 15, and "d" is an integer ranging from 0 to 15.

Item 2. The cleaner composition for removing lead-free soldering flux according to Item 1, wherein the cleaner composition comprises, as the halogen-free organic solvent (A), the compound represented by Formula (1-1) and the compound represented by Formula (1-2) at a weight ratio of 5/1 to 1/5.

Item 3. The cleaner composition for removing lead-free soldering flux according to Item 1 or 2, wherein the amine-based compound (B) is an N-alkyl dialkanolamine.

Item 4. The cleaner composition for removing lead-free soldering flux according to Item 3, wherein the N-alkyl dialkanolamine is at least one member selected from the group consisting of N-methyl diethanolamine, N-ethyl diethanolamine, N-butyl diethanolamine and N-propyl diethanolamine.

Item 5. The cleaner composition for removing lead-free soldering flux according to any one of Items 1 to 4, wherein the chelating agent having no amino group (C) is an aliphatic hydroxycarboxylic acid-based chelating agent and/or a (poly) phosphoric acid-based chelating agent.

Item 6. The cleaner composition for removing lead-free soldering flux according to Item 5, wherein the aliphatic hydroxycarboxylic acid-based chelating agent is at least one member selected from the group consisting of citric acid, isocitric acid and malic acid.

Item 7. The cleaner composition for removing lead-free soldering flux according to Item 5, wherein the (poly) phosphoric acid-based chelating agent is at least one member selected from the group consisting of orthophosphoric acid, pyrophosphoric acid and triphosphoric acid.

Item 8. The cleaner composition for removing lead-free soldering flux according to any one of Items 1 to 7, wherein the cleaner composition contains 0.01 to 30 parts by weight of the amine-based compound (B), 0.01 to 10 parts by weight of the chelating agent having no amino group (C), and 0 to 10 parts by weight of water, per 100 parts by weight of the halogen-free organic solvent (A).

Item 9. The cleaner composition for removing lead-free soldering flux according to any one of Items 1 to 8, wherein a measurement value measured by a B-type viscosity meter is 1 to 10 mPa·s/(20° C., 60 rpm, rotor No. 1) when the cleaner composition contains 5 wt. % of water.

Item 10. The cleaner composition for removing lead-free soldering flux according to any one of Items 1 to 9, wherein the cleaner composition does not contain a polyoxyalkylene phosphoric acid ester-based surfactant.

Item 11. A method for removing lead-free soldering flux, comprising bringing the cleaner composition for removing lead-free soldering flux according to any one of Items 1 to 10 in contact with lead-free soldering flux.

Item 12. A method for removing lead-free soldering flux, comprising spraying the cleaner composition for removing lead-free soldering flux according to any one of Items 1 to 10 to lead-free soldering flux to obtain a cleaned object, and spraying water to the cleaned object.

EFFECT OF THE INVENTION

The cleaner composition according to the present invention not only excels in safety and the like, but also has a property of dissolving flux residues adhered on narrow portions or in narrow gaps in an object to be cleaned that was subjected to soldering with a lead-free solder.

With such properties, the cleaner composition of the present invention is particularly suitable for the cleaning of a printed circuit board having a complicated and precise structure, such as a FC or BGA mounted board formed by using a lead-free solder.

The cleaner composition of the present invention reduces recontamination of the object to be cleaned in the water-rinsing process due to the dirt previously removed during the cleaning process.

When the cleaner composition of the present invention does not contain the polyoxyalkylene phosphate-base surfactant, the composition can reduce the foams in the spray-form water-rinsing process in addition to the gap-cleaning property and the contamination prevention property. Therefore, the cleaner composition of the present invention also has advantages to ease the control of the water-rinsing process, etc.

BEST MODE FOR CARRYING OUT THE INVENTION

The cleaner composition of the present invention is used to clean off "lead-free soldering flux", more specifically, a flux residue containing a tin derived from lead-free solder. Examples of "lead-free soldering flux" include (i) a flux residue generated after a soldering process using a paste formed of lead-free solder powder and a flux composition, and (ii) a flux residue generated after a process of soldering electrodes formed of lead-free solder via a flux composition.

Examples of the "lead-free solder" include Sn—Ag based solder, Sn—Cu based solder, Sn—Ag—Cu based solder, Sn—Zn based solder, and Sn—Sb based solder.

Examples of the "flux composition" include compositions mainly containing base resins such as resin acids (natural rosin, polymerized rosin, α,β-unsaturated carboxylic acid modified rosin or the like) or synthetic resins (acrylic resin, polyamide resin or the like); an activator (organic acids such as adipic acid, halogen-based compounds such as silver diethylamine hydrobromide or the like); a thixotropic agent (hydrogenated castor oil, hydroxy stearic acid ethylene bisamide or the like); a solvent (diethyleneglycol mono hexyl ether, diethyleneglycol monobutyl ether or the like) or the like.

Cleaner Composition for Removing Lead-Free Soldering Flux

The cleaner composition of the present invention is characterized by comprising a halogen-free organic solvent (A) (Component (A), hereinafter) formed of a compound represented by the following Formula (1-1) and/or a compound represented by the following Formula (1-2); an amine-based compound (B) represented by the following Formula (2) (Component (B), hereinafter); an chelating agent having no amino group (C) (Component (C), hereinafter); and, as required, water.

The following is the compound represented by Formula (1-1) used for Component (A).

[Chem. 4]

(1-1)

wherein $R^1$ represents $C_{1-6}$ alkyl group, $R^2$ represents methyl group or hydrogen atom, $X^1$ represents $C_{1-5}$ alkyl group or hydrogen atom, and "a" represents an integer ranging from 2 to 4.

The compound is not particularly limited, and may be selected from various known alkylene glycol ethers. Examples thereof include diethyleneglycol ethers such as diethyleneglycol monomethyl ether, diethyleneglycol dimethyl ether, diethyleneglycol monoethyl ether, diethyleneglycol diethyl ether, diethyleneglycol methyl ethyl ether, diethyleneglycol mono propyl ether, diethyleneglycol dipropyl ether, diethyleneglycol methyl propyl ether, diethyleneglycol ethyl propyl ether, diethyleneglycol monobutyl ether, diethyleneglycol dibutyl ether, diethyleneglycol methyl butyl ether, diethyleneglycol ethyl butyl ether, diethyleneglycol propyl butyl ether, diethyleneglycol mono pentyl ether, diethyleneglycol dipentyl ether, diethyleneglycol methyl pentyl ether, diethyleneglycol ethylpentyl ether, diethyleneglycol propylpentyl ether, diethyleneglycol butyl pentyl ether, or diethyleneglycol mono hexyl ether; tri- or tetra-ethyleneglycol ethers corresponding to said diethylene glycol ethers; and glycol ethers that are said alkylene glycol ethers in which $R^2$ is a methyl group. These compounds may be used solely or in combination. Among them, diethyleneglycol monobutyl ether, diethyleneglycol dibutyl ether, and diethyleneglycol mono hexyl ether are particularly preferred in terms of the safety and the like, and in terms of the gap-cleaning property.

The following is the compound represented by Formula (1-2) used for Component (A).

[Chem. 5]

(1-2)

wherein $R^3$ represents $C_{1-6}$ alkyl group, $R^4$ represents methyl group or hydrogen atom, $X^2$ represents $C_{1-5}$ alkyl group or hydrogen atom, and "b" represents an integer ranging from 2 to 4.

The compound is not particularly limited, and may be selected from various known compounds. Examples of the compounds include the compounds represented by Formula (1-1), wherein the "$R^1$—O—" portion in the formula is replaced with "$R^3$—COO—". These compounds may be used solely or in combination. Among them, diethyleneglycol monoethyl ether acetate, diethyleneglycol monobutyl ether acetate, diethyleneglycol mono propyl ether acetate and the like are particularly preferred in terms of safety and the like, and in terms of the gap-cleaning property.

By using the cleaner composition of the present invention containing the compound represented by Formula (1-1) and the compound represented by Formula (1-2) as Component (A) at a weight ratio of about 5/1 to 1/5, preferably 2/1 to 1/5, it is possible to lower the viscosity of the cleaner while maintaining the property of dissolving lead-free soldering flux, thereby improving the gap-cleaning property.

As required, the cleaner composition of the present invention may contain another halogen-free organic solvent in addition to Component (A). Examples of other halogen-free organic solvents include nitrogen-containing compound-based solvents (1,3-dimethyl-2-imidazolidinone, 1,3-diethyl-2-imidazolidinone, 1,3-dipropyl-2-imidazolidinone, N-methyl-2-pyrrolidone or the like), hydrocarbon-based solvents (hexane, heptane, octane or the like), alcohol-based solvents (methanol, ethanol, benzyl alcohol or the like), ketone-based solvents (acetone, methyl ethyl ketone or the like), ether-based solvents (diethyl ether, tetrahydrofuran, glycol ethers or the like), and ester-based solvents (ethyl acetate, methyl acetate or the like). These compounds may be used solely or in combination.

Component (B) is represented by the following Formula (2).

[Chem. 6]

(2)

wherein $R^5$ represents $C_{1-7}$ alkyl group, Y represents $C_{1-5}$ alkyl group or hydrogen atom, "c" is an integer ranging from 1 to 15, and "d" is an integer ranging from 0 to 15.

The compound (B) is not particularly limited, and may be selected from various known compounds. Examples of the compounds include N-alkyl dialkanolamines (N-methyl diethanolamine, N-ethyl diethanolamine, N-butyl diethanolamine, N-propyl diethanolamine or the like); and a reaction product of a primary aliphatic amine (octyl amine, decyl amine, dodecyl amine, tetra decyl amine, hexa decyl amine, 2-ethylhexyl amine or the like) represented by Formula (2) wherein $R^5$ represents alkyl group, and an ethylene oxide with the repeating unit represented by said "c". These compounds may be used solely or in combination. Among them, N-alkyl dialkanolamines are preferable, and at least one member selected from the group consisting of N-methyl diethanolamines, N-ethyl diethanolamines, N-butyl diethanolamines and N-propyl diethanolamines is particularly preferable, in terms of safety and the like, particularly in terms of the contamination prevention property and low-foaming property.

Component (C) is not particularly limited, and may be selected from various known chelating agents insofar as it does not contain an amino group in the molecule. In terms of the gap-cleaning property, and particularly in terms of the contamination prevention property, aliphatic hydroxycarboxylic acid-based chelating agents and/or (poly) phosphoric acid-based chelating agents are preferable.

A typical example of the aliphatic hydroxycarboxylic acid-based chelating agents is a hydroxy carboxylic acid, which is formed of a straight chain alkyl group having a carbon number of about 2 to 5 as its basic structure; and about 2 to 3 carboxyl groups and about 1 to 3 hydroxy groups bonded thereto. Examples of hydroxy carboxylic acids include citric acid, isocitric acid, malic acid, tartaric acid, and their salts (hereinafter, the salts represent sodium salts, potassium salts, ammonium salts, alkanol amine salts and the like). Among them, in terms of the gap-cleaning property, and particularly in terms of the contamination prevention property, at least one member selected from the group consisting of citric acid, isocitric acid and malic acid is preferable, and citric acid are particularly preferable.

The (poly) phosphoric acid-based chelating agent is preferably at least one member selected from the group consisting of orthophosphoric acid, pyrophosphoric acid and triphosphoric acid in terms of the gap-cleaning property, and particularly in terms of the contamination prevention property. Pyrophosphoric acid is particularly preferable.

If a chelating agent having an amino group in the molecule is used instead of Component (C), it is likely to cause recontamination of the object to be cleaned during the water-rinsing process. Examples of the chelating agents having an amino group in the molecule include ethylene diamine tetraacetic acid and 2-hydroxyethylimino diacetic acid.

Examples of water include pure water, ion exchange water, and purified water.

The cleaner composition of the present invention may contain various known additives insofar as the desired effects of the present invention are not impaired. Examples of the additives include various surfactants such as nonionic surfactants (excluding the compounds used as Components (A) and (B)), anionic surfactants, or cationic surfactants; antifoaming agents; antirusts; and antioxidants.

Examples of the nonionic surfactants include a compound represented by Formula (3): $R^6$—O—$(CH_2$—$CH_2$—O$)_e$—H (wherein $R^6$ represents $C_{8-20}$ alkyl group, and "e" represents an integer ranging from 0 to 20); ethylene oxide adducts of fatty acid amides; sorbitan fatty acid esters; sucrose fatty acid esters; fatty acid alkanol amides, and corresponding polyoxypropylene-based surfactants thereof. These surfactants may be used solely or in combination.

Examples of the anionic surfactants include sulfuric acid ester-based anionic surfactants (higher alcohol sulfuric acid ester salts, alkylsulfuric acid ester salts, polyoxyethylene alkylsulfuric acid ester salts or the like); and sulfonic acid salt-based anionic surfactants (alkyl sulfonic acid salts, alkyl benzene sulfonic acid salts or the like). These surfactants may be used solely or in combination.

Examples of the cationic surfactant include alkyl ammonium salts, and quaternary ammonium salts. These surfactants may be used solely or in combination.

Examples of the amphoteric surfactant include betaine amphoteric surfactants, and amino-acid amphoteric surfactants. These surfactants may be used solely or in combination.

The content of each component of the cleaner composition of the present invention is not particularly limited. However, in view of the desired effects of the present invention, the content of Component (B) is about 0.01 to 30 parts by weight (preferably 0.1 to 5 parts by weight), the content of Component (C) is about 0.01 to 10 parts by weight (preferably 0.02 to 1 part by weight), and the content of water is about 0 to 10 parts by weight (preferably 1 to 8 parts by weight) per 100 parts by weight of Component (A). The content of the above additives is generally about less than 5 parts by weight.

The viscosity of the cleaner composition of the present invention is not particularly limited. However, to ensure the gap-cleaning property, the viscosity measured by a B-type viscosity meter is preferably 1 to 10 mPa·s (20° C., 60 rpm, rotor No. 1) when the composition contains 5 wt. % of water. This viscosity expressed by "mPa·s (20° C., 60 rpm, rotor No. 1)" denotes a viscosity value of a cleaner composition whose liquid temperature is 20° C., measured by a B-type viscosity meter using a rotor No. 1 rotated at 60 rpm. The pH of the cleaner composition in the viscosity measurement is generally 2 to 10.

Method for Removing Lead-Free Soldering Flux

By bringing the cleaner composition of the present invention in contact with lead-free soldering flux adhered to the object to be cleaned, it is possible to remove lead-free soldering flux from the object.

The method of using the cleaner composition of the present invention is not particularly limited, and various known methods may be adopted. Examples of the methods include a method of spraying the cleaner onto an object to which the lead-free soldering flux is adhered by means of a spray device (see Japanese Unexamined Patent Publication No. 2007-096127); a method of subjecting the object immersed in the cleaner composition to ultrasonic cleaning; and a method of using a direct cleaning device (e.g., "Direct Pass™", product of Arakawa Chemical Industries, Ltd.: Japanese Patent No. 2621800).

After removing the lead-free soldering flux using the cleaner composition of the present invention, the cleaned object is preferably rinsed with water. It is particularly preferable that the removal method of the present invention is carried out by spraying the cleaner composition to lead-free soldering flux to obtain a cleaned object, and then spraying water to the cleaned object.

The rinsing process may be repeatedly performed. For example, by rinsing the cleaned object by sequentially carrying out the pre-rinsing process and the post-rinsing process, the cleaner composition on the object can be effectively removed.

The pre-rinsing process is carried out according to conventional pre-rinsing processes using purified water and the like.

The post-rinsing process is carried out according to conventional methods. For example, the object that has been subjected to the pre-rinsing process is rinsed with purified water and the like.

If required, a drying process may be performed after the pre-rinsing process and/or the post-rinsing process.

When the rinsing process is performed by spraying water to the object to be cleaned, it is preferable that the cleaner of the present invention does not contain a surfactant (the various surfactants listed above), to ensure the low-foaming property.

It is particularly preferable to avoid a polyoxyalkylene phosphoric acid ester-based surfactant among the anionic surfactants. Examples of the polyoxyalkylene phosphoric acid ester-based surfactants include a compound represented by Formula (4): $R^7$—O—$(CH_2$—$CH_2$—O$)_f$—P(=O)(—Z)—OH, wherein $R^7$ represents $C_{5-20}$ alkyl group; "f" is an integer ranging from 0 to 20; and "Z" represents a polyoxyalkylene ether group or hydroxy group, or its salt.

EXAMPLES

The present invention is more specifically explained below in reference to Examples and Comparative Examples. The present invention is, however, not limited to the examples.

Preparation of Cleaner Composition

The components shown in Table 1 below (based on wt. %) were mixed to prepare the respective cleaner compositions of Examples 1 to 16 and Comparative Examples 1 to 5.

TABLE 1

| | (A) | | (B) | (C) | | | | Others | | | |
|---|---|---|---|---|---|---|---|---|---|---|---|---|
| | BDG | HeDG | EDGA | MBD | CA | MA | PA | Water | EDTA | 212C | 208B | Vis |
| Example 1 | 93.0 | | | 1.5 | 0.5 | | | 5 | | | | 9.2 |
| Example 2 | 93.0 | | | 1.5 | | | 0.5 | 5 | | | | 9.4 |
| Example 3 | 94.0 | | | 0.9 | 0.1 | | | 5 | | | | 9.3 |
| Example 4 | 93.4 | | | 1.5 | | 0.1 | | 5 | | | | 9.4 |
| Example 5 | 94.0 | | | 0.9 | | | 0.1 | 5 | | | | 9.3 |
| Example 6 | 92.0 | | | 1.5 | 0.5 | | | 5 | | 1 | | 9.7 |
| Example 7 | 62.0 | | 31.0 | 1.5 | 0.5 | | | 5 | | | | 7.4 |
| Example 8 | 31.0 | | 62.0 | 1.5 | 0.5 | | | 5 | | | | 6.3 |
| Example 9 | 46.5 | | 46.5 | 1.5 | 0.5 | | | 5 | | | | 6.8 |
| Example 10 | 46.5 | | 46.5 | 1.5 | | 0.5 | | 5 | | | | 6.8 |
| Example 11 | 46.5 | | 46.5 | 1.5 | | | 0.5 | 5 | | | | 7.0 |
| Example 12 | 47.0 | | 47.0 | 0.9 | 0.1 | | | 5 | | | | 6.8 |
| Example 13 | 47.0 | | 47.0 | 0.9 | | | 0.1 | 5 | | | | 6.9 |
| Example 14 | 46.0 | | 46.0 | 1.5 | 0.5 | | | 5 | | 1 | | 7.0 |
| Example 15 | 46.0 | | 46.0 | 1.5 | 0.5 | | | 5 | | | 1 | 7.0 |
| Example 16 | 43.5 | 49.5 | | 1.5 | 0.5 | | | 5 | | | | 10.1 |
| Comparative Example 1 | 47.5 | | 47.0 | | 0.5 | | | 5 | | | | 6.7 |
| Comparative Example 2 | 47.0 | | 47.0 | | | | | 5 | | 1 | | 6.8 |
| Comparative Example 3 | 93.5 | | | 1.5 | | | | 5 | | | | 9.1 |
| Comparative Example 4 | 44.0 | 49.5 | | 1.5 | | | | 5 | | | | 10.1 |
| Comparative Example 5 | 47.0 | | 47.0 | 0.9 | | | | 5 | 0.1 | | | 6.8 |

The following is an explanation of the abbreviations used in Table 1.

BDG: diethyleneglycol monobutyl ether
HeDG: diethyleneglycol monohexyl ether
EDGA: diethyleneglycol monoethyl ether acetate
MBD: N-butyl diethanolamine
CA: citric acid
MA: malic acid
PA: pyrophosphoric acid
EDTA: ethylene diamine tetra-acetic acid
212C: polyoxyethylene alkyl ether phosphoric acid monoester (product name: "Plysurf A212C", product of Dai-ichi Kogyo Seiyaku Co., Ltd.)
208B: polyoxyethylene alkyl ether phosphoric acid monoester (product name: "Plysurf A208B", product of Dai-ichi Kogyo Seiyaku Co., Ltd.)
Vis: measurement value measured by a B-type viscosity meter (product name: "B8M", Tokimec Inc.; rotor No. 1) at 20° C. and 60 rpm Preparation of Lead-Free Soldering Flux A commercially available lead-free solder paste (product name: "TASLF-219", Arakawa Chemical Industries, Ltd.; composition of lead-free solder powder: Sn=96.5%, Ag=3.0%, Cu=0.5%) was placed in a glass vial. The glass vial was heated on a hot plate at 270° C. to dissolve the lead-free solder powder. The resultant fluid from the melt-blending separated into deposited solder alloys and a flux component. This flux component was used as a model of a flux residue derived from soldering using a lead-free solder. The following experiments used this flux component as lead-free soldering flux.

A portion of the lead-free soldering flux component was collected, and its tin concentration was measured by a wavelength dispersive X-ray fluorescence spectrometer (product name: "ZSX100e", Rigaku Corporation). 5 wt. % of tin was detected.

Production of Model Cell Used for Cleaning Experiment

Two small glass plates (0.6 cm (Height)×1 cm (Width)×350 μm (Thickness)) serving as spacers were placed side by side at an interval of 0.3 cm on a glass supporting plate (0.6 cm (Height)×3 cm (Width)×1 mm (Thickness)), and the above lead-free soldering flux was poured in the portion between the small glass plates.

Thereafter, the two small glass plates were covered with another glass plate equal in size to the supporting plate, and the fluxes that ran over the edges were removed, thereby completing a model cell to be used for a cleaning experiment in which the lead-free soldering flux was contained in a narrow gap (Opening space: 0.3 cm×350 μm, Depth=0.6 cm).

Using this cleaning experiment model cell, the following experiments 1 to 3 were carried out.

Experiment 1

Evaluation of Gap-Cleaning Property

The model cell was immersed in the cleaner composition (liquid temperature=70° C.) according to Example 1. The model cell was taken out of the cleaner composition after ten minutes of stirring, and the total area of the portions where the flux dissolved through both openings (the total area is hereinafter referred to as a dissolution area (mm$^2$)) was calculated. The same experiment was carried out for the compositions of Examples 2 to 16, and the compositions of Comparative Examples 1 to 5.

A larger dissolution area denotes a greater property of dissolving flux residue in the narrow portion of the object to be cleaned.

Experiment 2

Evaluation of Contamination Prevention Property

The lead-free soldering flux was dispersed in the cleaner composition of Example 1 (1 wt. % per cleaner) to prepare a test liquid (contaminated liquid). The test liquid was dispersed in ion exchange water (rinse liquid) by stirring so that the concentration of the test liquid gradually became 1 wt. %, 3 wt. %, and 5 wt. %. The turbidity of the dispersion liquid at each concentration was evaluated visually using the following criteria. The same experiment was carried out for the compositions of Examples 2 to 16, and the compositions of Comparative Examples 1 to 5.

The presence of turbidness was used as an index of recontamination of the object during the water-rinsing process. Table 2 shows the results.

A: Dispersion liquid was transparent.
B: Dispersion liquid was slightly cloudy.
C: Dispersion liquid was significantly cloudy.

Experiment 3

Evaluation of Low-Foaming Property

Ion exchange water was added to the cleaner composition of Example 1, and then the liquid was diluted until the content of cleaner became 1 wt. %. 5 cc of the diluted liquid was poured in a glass test tube ($\phi$15 mm×150 mm), and the test tube was sealed. Next, the test tube was shaken ten times. The liquid was then allowed to stand for 10 seconds, and the heights (cm) of the foams were measured. The same experiment was carried out for the compositions of Examples 2 to 16, and the compositions of Comparative Examples 1 to 5.

A greater height of the foams denotes increased foam generation during the water-rinsing process (spray form). Table 2 shows the result.

TABLE 2

| | Gap-cleaning property ($mm^2$) | Contamination prevention property | | | Low-foaming property (cm) |
|---|---|---|---|---|---|
| | | 1 wt. % | 3 wt. % | 5 wt. % | |
| Example 1 | 5.4 | A | A | A | 0.8 |
| Example 2 | 5.2 | A | A | A | 1.0 |
| Example 3 | 5.4 | A | A | A | 0.9 |
| Example 4 | 5.5 | A | A | B | 0.9 |
| Example 5 | 5.3 | A | A | A | 1.0 |
| Example 6 | 5.5 | A | A | B | 4.5 |
| Example 7 | 6.4 | A | A | A | 0.6 |
| Example 8 | 8.0 | A | A | A | 0.4 |
| Example 9 | 7.4 | A | A | A | 0.5 |
| Example 10 | 7.4 | A | A | B | 0.4 |
| Example 11 | 7.2 | A | A | A | 0.6 |
| Example 12 | 7.4 | A | A | A | 0.5 |
| Example 13 | 7.4 | A | A | A | 0.7 |
| Example 14 | 7.0 | A | A | B | 4.0 |
| Example 15 | 7.0 | A | A | B | 2.8 |
| Example 16 | 4.6 | A | A | A | 0.7 |
| Comparative Example 1 | 7.2 | B | C | C | 0.6 |
| Comparative Example 2 | 7.0 | B | C | C | 3.8 |
| Comparative Example 3 | 5.2 | C | C | C | 0.8 |
| Comparative Example 4 | 4.4 | C | C | C | 0.6 |
| Comparative Example 5 | 7.3 | C | C | C | 0.6 |

Production of Soldered Substrate (Object to be Cleaned)

A 10 cm×10 cm glass epoxy substrate having 3×3 electrode regions was prepared. In each electrode region, 25×25 planar electrodes, each of which had a diameter of 100 μm, were arranged to form a square.

Then, the commercial lead-free solder paste product was applied on the planar electrodes disposed on the four sides of each electrode region by screen printing, using a metal squeegee (squeegee speed=20 mm/second, plate separation speed=0.1 mm/second). Next, a 5 mm×5 mm IC chip (having 25×25 electrodes) was mounted in each electrode region (9 in total). Afterward, the soldering substrate having an IC chip was subjected to soldering by being heated for 90 seconds in a nitrogen atmosphere reflow oven (pre-heating: 150 to 160° C.), thereby obtaining a soldered substrate. In the soldered substrate, the gap between the IC chip and the glass epoxy substrate was 50 μm.

Figure 1:
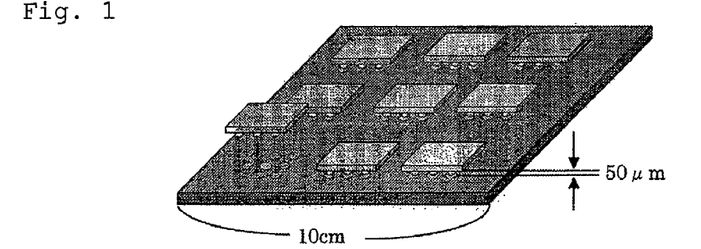
FIG. 1 illustrates a schematic view of a soldered substrate according to the Examples.

FIG. 1 shows a schematic view of the obtained soldered substrate.

Cleaning of Soldered Substrate

The soldered substrate was washed using a cleaning station (Tornado Jet™, Arakawa Chemical Industries, Ltd., FIG. 2) comprising a spray-type cleaning device and a liquid tank.

Figure 2:
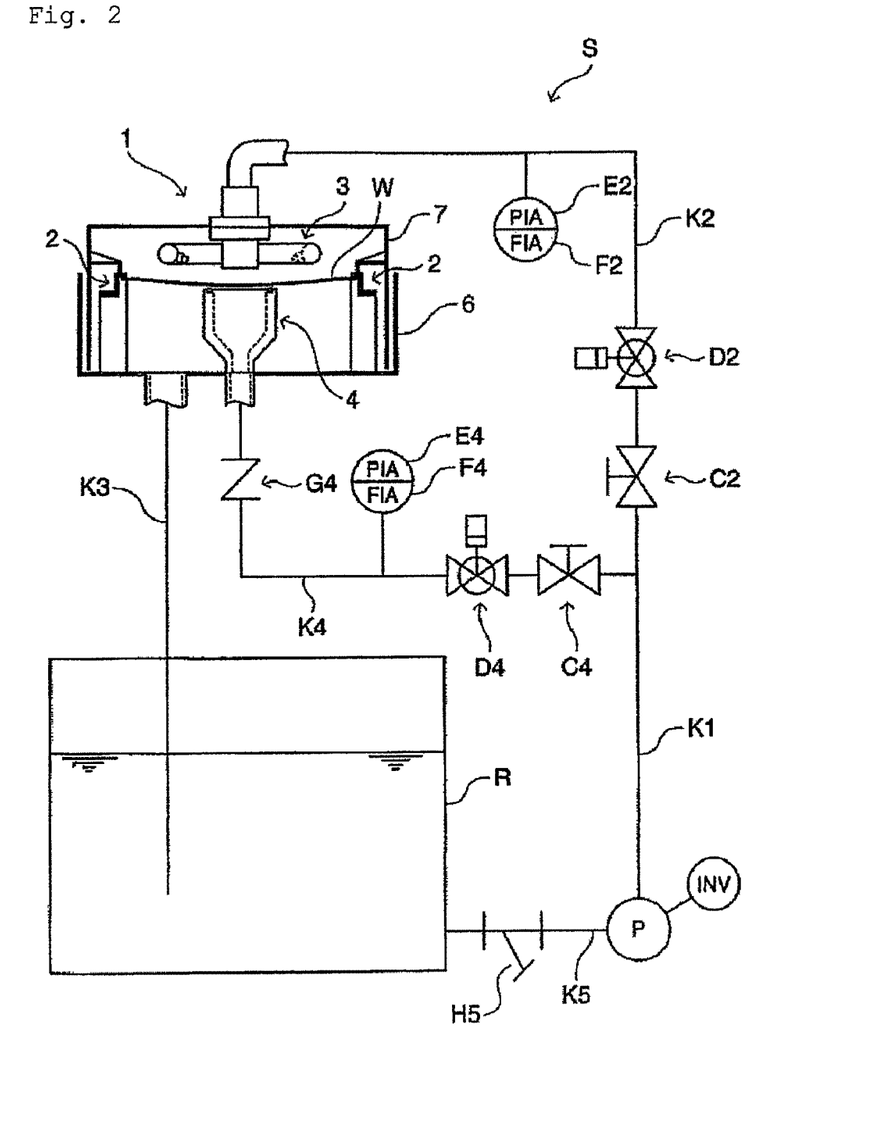
FIG. 2 illustrates a schematic view of a cleaning station, a pre-rinsing station and a post-rinsing station used in the Examples.

First, the soldered substrate was set in the region "W" in the cleaning device 1, with the IC chip facing upward. Next, the cleaner composition (liquid temperature=70° C.) of Example 1 was sprayed (3 kg/cm², 2 minutes) in a fan-like motion into a plane having the IC chip of the soldered substrate using a spray nozzle (spraying device 3) that rotated in the planar direction of the soldered substrate, thereby cleaning the soldered substrate.

Pre-Rinsing Process

The cleaned soldered substrate was set in the region "W" in the pre-rinsing device 1 in the pre-rinsing station (same structure as in FIG. 2) adjacent to the cleaning station, with the IC chip facing upward. Next, the pre-rinsing process was carried out by spraying a rinse liquid (liquid temperature=25° C.) in fan-like pattern (injection pressure=1 kg/cm², 2 minutes) onto the IC-tips side of the soldered substrate from the spraying nozzle (spraying device 3) which rotates in planar direction of the substrate. The rinse liquid was an aqueous solution obtained by dissolving the cleaner composition in purified water (content of the composition in the aqueous solution=3 wt. %). This cleaner composition dissolved in purified water was created to reproduce the condition (contamination condition) of using a closed-circuit rinsing device (see FIG. 2) in which the rinse liquid is recycled.

Experiment 4

Evaluation of Low-Foaming Property

The rinsing effect was evaluated visually based on the height of foams generated at the liquid surface (the liquid surface of the used rinse liquid) of the liquid tank R (area of liquid tank opening=2205 cm²) immediately after the pre-rinsing process. The height from the liquid surface to the liquid tank inlet was 10 cm.

A: Few foams were generated at the liquid surface.
B: Foams were generated to half the height of the distance from the liquid surface to the liquid tank inlet.
C: Foams overflowed from the tank inlet.

Post-Rinsing Process

The soldered substrate after the pre-rinsing process was set in the region "W" in the post-rinsing device 1 in the post-rinsing station (the same structure as in FIG. 2) adjacent to the pre-rinsing station. Next, the post-rinsing process was carried out by spraying purified water (liquid temperature=25° C.) in fan-like pattern (injection pressure=3 kg/cm², 2 minutes) onto the IC-tips side of the soldered substrate from the spraying nozzle (spraying device 3) which rotates in planar direction of the substrate.

The cleaning process, pre-rinsing process, and post-rinsing process of the soldered substrate were carried out with respect to the cleaner compositions of Examples 2 to 16, and the cleaner compositions of Comparative Example 1 to 5 according to the above method.

Experiment 5

Evaluation of Effect of Substrate Cleaning

After the post-rinsing process, all soldered substrates were aired, and then all IC chips were removed therefrom. Next, the number of electrode regions in which the flux residue was visually confirmed was counted. The greater the number, the poorer the cleaning effect.

A: None of the electrode regions had flux residue.
B: Flux residue was confirmed in 1 to 2 electrode regions.
C: Flux residue was confirmed in 3 to 4 electrode regions.
D: Flux residue was confirmed in 5 or more electrode regions.

TABLE 3

|  | Low-foaming property (Experiment 4) | Substrate-cleaning property (Experiment 5) |
|---|---|---|
| Example 1 | A | A |
| Example 2 | A | A |
| Example 3 | A | A |
| Example 4 | A | A |
| Example 5 | A | A |
| Example 6 | C | A |
| Example 7 | A | A |
| Example 8 | A | A |
| Example 9 | A | A |
| Example 10 | A | A |
| Example 11 | A | A |
| Example 12 | A | A |
| Example 13 | A | A |
| Example 14 | C | A |
| Example 15 | C | A |
| Example 16 | A | A |
| Comparative Example 1 | A | B |
| Comparative Example 2 | C | B |
| Comparative Example 3 | A | C |
| Comparative Example 4 | A | D |
| Comparative Example 5 | A | B |

REFERENCE NUMERALS

1: cleaning device, pre-rinsing device or post-rinsing device
2: supporting unit
3: spraying device
4: liquid supplying device
6: liquid receiving unit
7: lid unit
C2, C4: control valve
D2, D4: automatic valve
E2, E4: manometer
F2, F4: flow rate meter
G4: check valve
H5: strainer
K1, K2, K3, K4, K5: tube
P: pump
R: liquid tank
S: cleaning station
W: substrate

The invention claimed is:

1. A cleaner composition for removing lead-free soldering flux, consisting of a halogen-free organic solvent (A) formed of a compound represented by Formula (1-1) and/or a compound represented by Formula (1-2); an amine-based compound (B) represented by Formula (2); a chelating agent having no amino group (C); as required, water, and as required, nonionic surfactants (excluding the compounds used as Components (A) and (B)), anionic surfactants (excluding polyoxyethylene phosphoric acid ester-based surfactants), cationic surfactants, antifoaming agents, antirusts, and antioxidants, the cleaner composition containing 0.01 to 30 parts by weight of the amine-based compound (B), 0.01 to 10 parts by weight of the chelating agent having no amino group (C), and 0 to 10 parts by weight of water, per 100 parts by weight of the halogen-free organic solvent (A)

[Chem. 1]

(1-1)

wherein $R^1$ represents $C_{1-6}$ alkyl group, $R^2$ represents methyl group or hydrogen atom, $X^1$ represents $C_{1-5}$ alkyl group or hydrogen atom, and "a" represents an integer ranging from 2 to 4,

[Chem. 2]

(1-2)

wherein $R^3$ represents $C_{1-6}$ alkyl group, $R^4$ represents methyl group or hydrogen atom, $X^2$ represents $C_{1-5}$ alkyl group or hydrogen atom, and "b" represents an integer ranging from 2 to 4,

[Chem. 3]

(2)

wherein $R^5$ represents $C_{1-7}$ alkyl group, Y represents $C_{1-5}$ alkyl group or hydrogen atom, "c" is an integer ranging from 1 to 15, and "d" is an integer ranging from 0 to 15.

2. The cleaner composition for removing lead-free soldering flux according to claim 1, wherein the cleaner composition comprises, as the halogen-free organic solvent (A), the compound represented by Formula (1-1) and the compound represented by Formula (1-2) at a weight ratio of 5/1 to 1/5.

3. The cleaner composition for removing lead-free soldering flux according to claim 1, wherein the amine-based compound (B) is an N-alkyl dialkanolamine.

4. The cleaner composition for removing lead-free soldering flux according to claim 3, wherein the N-alkyl dialkanolamine is at least one member selected from the group consisting of N-methyl diethanolamine, N-ethyl diethanolamine, N-butyl diethanolamine and N-propyl diethanolamine.

5. The cleaner composition for removing lead-free soldering flux according to claim 1, wherein the chelating agent having no amino group (C) is an aliphatic hydroxycarboxylic acid-based chelating agent and/or a (poly) phosphoric acid-based chelating agent.

6. The cleaner composition for removing lead-free soldering flux according to claim 5, wherein the aliphatic hydroxycarboxylic acid-based chelating agent is at least one member selected from the group consisting of citric acid, isocitric acid and malic acid.

7. The cleaner composition for removing lead-free soldering flux according to claim 5, wherein the (poly) phosphoric acid-based chelating agent is at least one member selected from the group consisting of orthophosphoric acid, pyrophosphoric acid and triphosphoric acid.

8. The cleaner composition for removing lead-free soldering flux according to claim 1, wherein a measurement value measured by a B-type viscosity meter is 1 to 10 mPa·s/(20° C., 60 rpm, rotor No. 1) when the cleaner composition contains 5 wt. % of water.

9. A method for removing lead-free soldering flux, comprising bringing the cleaner composition for removing lead-free soldering flux according to claim 1 in contact with lead-free soldering flux.

10. A method for removing lead-free soldering flux, comprising spraying the cleaner composition for removing lead-free soldering flux according to claim 1 to lead-free soldering flux to obtain a cleaned object, and spraying water to the cleaned object.

11. The cleaner composition for removing lead-free soldering flux according to claim 2, wherein the amine-based compound (B) is an N-alkyl dialkanolamine.

12. The cleaner composition for removing lead-free soldering flux according to claim 11, wherein the N-alkyl dialkanolamine is at least one member selected from the group consisting of N-methyl diethanolamine, N-ethyl diethanolamine, N-butyl diethanolamine and N-propyl diethanolamine.

13. The cleaner composition for removing lead-free soldering flux according to claim 2, wherein the chelating agent having no amino group (C) is an aliphatic hydroxycarboxylic acid-based chelating agent and/or a (poly) phosphoric acid-based chelating agent.

14. The cleaner composition for removing lead-free soldering flux according to claim 13, wherein the aliphatic hydroxycarboxylic acid-based chelating agent is at least one member selected from the group consisting of citric acid, isocitric acid and malic acid.

15. The cleaner composition for removing lead-free soldering flux according to claim 13, wherein the (poly) phosphoric acid-based chelating agent is at least one member selected from the group consisting of orthophosphoric acid, pyrophosphoric acid and triphosphoric acid.

16. The cleaner composition for removing lead-free soldering flux according to claim 3, wherein the cleaner composition contains 0.01 to 30 parts by weight of the amine-based compound (B), 0.01 to 10 parts by weight of the chelating agent having no amino group (C), and 0 to 10 parts by weight of water, per 100 parts by weight of the halogen-free organic solvent (A).

17. The cleaner composition for removing lead-free soldering flux according to claim 5, wherein the cleaner composition contains 0.01 to 30 parts by weight of the amine-based compound (B), 0.01 to 10 parts by weight of the chelating agent having no amino group (C), and 0 to 10 parts by weight of water, per 100 parts by weight of the halogen-free organic solvent (A).

* * * * *